United States Patent
Hong et al.

(10) Patent No.: US 12,222,748 B2
(45) Date of Patent: Feb. 11, 2025

(54) CLOCK GENERATING CIRCUIT

(71) Applicant: Himax Imaging Limited, Tainan (TW)

(72) Inventors: Ghia-Ming Hong, Tainan (TW);
Zheng-Zhi Huang, Tainan (TW);
Puo-Tsang Huang, Tainan (TW);
Ya-Sen Chang, Tainan (TW);
Chen-Cheng-Hung Hung, Tainan (TW)

(73) Assignee: Himax Imaging Limited, Tainan (TW)

( * ) Notice: Subject to any disclaimer, the term of this patent is extended or adjusted under 35 U.S.C. 154(b) by 32 days.

(21) Appl. No.: 18/131,845

(22) Filed: Apr. 6, 2023

(65) Prior Publication Data

US 2024/0338052 A1    Oct. 10, 2024

(51) Int. Cl.
*G06F 1/10* (2006.01)

(52) U.S. Cl.
CPC ..................... *G06F 1/10* (2013.01)

(58) Field of Classification Search
CPC ........................................................ G06F 1/10
See application file for complete search history.

(56) References Cited

U.S. PATENT DOCUMENTS

| | | | |
|---|---|---|---|
| 4,353,032 A * | 10/1982 | Taylor | G01R 31/3177 714/E11.155 |
| 5,387,825 A * | 2/1995 | Cantrell | H03K 5/1252 327/551 |
| 5,553,275 A * | 9/1996 | Langendorf | G06F 1/12 713/500 |
| 6,750,693 B1 | 6/2004 | Duewer | |
| 7,103,131 B1 * | 9/2006 | Byran | H03L 7/091 375/375 |
| 2007/0152720 A1 * | 7/2007 | Koh | H03K 23/425 327/115 |
| 2007/0194962 A1 * | 8/2007 | Asayama | H04N 25/78 341/144 |
| 2009/0108879 A1 * | 4/2009 | Kelkar | G01R 23/005 327/40 |
| 2013/0207703 A1 * | 8/2013 | Bulzacchelli | H03K 17/005 327/164 |
| 2020/0387426 A1 * | 12/2020 | Jain | G06F 11/076 |
| 2021/0160450 A1 * | 5/2021 | Han | H03K 23/005 |
| 2021/0208621 A1 * | 7/2021 | Chiang | H03L 7/1976 |

FOREIGN PATENT DOCUMENTS

TW    202044770 A    12/2020

* cited by examiner

*Primary Examiner* — Faisal M Zaman
(74) *Attorney, Agent, or Firm* — Winston Hsu (57) ABSTRACT

A clock generating circuit includes an input terminal, configured to receive a clock signal; an output terminal, configured to output an output signal; a gray counter circuit, coupled to the input terminal, and configured to divide the clock signal to produce a first output signal; and a shielding circuit, coupled to the input terminal, the gray counter circuit and the output terminal, and configured to shield a glitch in the first output signal to generate the output signal according to the clock signal.

3 Claims, 7 Drawing Sheets

CLOCK GENERATING CIRCUIT

BACKGROUND OF THE INVENTION

1. Field of the Invention

The present invention relates to a clock generating circuit, and more particularly, to a clock generating circuit using a gray counter.

2. Description of the Prior Art

An image sensor circuit includes an analog-to-digital convertor (ADC) that converts a sensed analog signal into a digital signal, and a clock generator that supplies a clock signal to the ADC. In the current applications, the frequency of the clock signal used by the ADC is very high. For instance, in the 0.11 µm process with SS/LV/HT process conditions and an operating frequency of the ADC greater than 800 MHZ, the duty cycle of the clock signal is likely to exceed 45% and 55%, resulting in missing code in the ADC.

In order to avoid missing code in the ADC, the clock generator uses a gray counter to divide the clock signal by 2 and obtain a clock signal with a better duty cycle. However, the clock signal output by the gray counter often has a glitch at a high frequency, which may cause the ADC to malfunction.

Under these circumstances, eliminating the glitch in the clock signal output by the gray counter has become one of the goals in the industry.

SUMMARY OF THE INVENTION

The present invention is to provide a clock generating circuit to solve the above problems.

The present invention provides a clock generating circuit, comprising an input terminal, configured to receive a clock signal; an output terminal, configured to output an output signal; a gray counter circuit, coupled to the input terminal, and configured to divide the clock signal to produce a first output signal; and a shielding circuit, coupled to the input terminal, the gray counter circuit and the output terminal, and configured to shield a glitch in the first output signal to generate the output signal according to the clock signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, hardware manufacturers may refer to a component by different names. This document does not intend to distinguish between components that differ in name but not function. In the following description and in the claims, the terms "include" and "comprise" are utilized in an open-ended fashion, and thus should be interpreted to mean "include, but not limited to". Also, the term "couple" is intended to mean either an indirect or direct electrical connection. Accordingly, if one device is coupled to another device, that connection may be through a direct electrical connection, or through an indirect electrical connection via other devices and connections.

Figure 1:
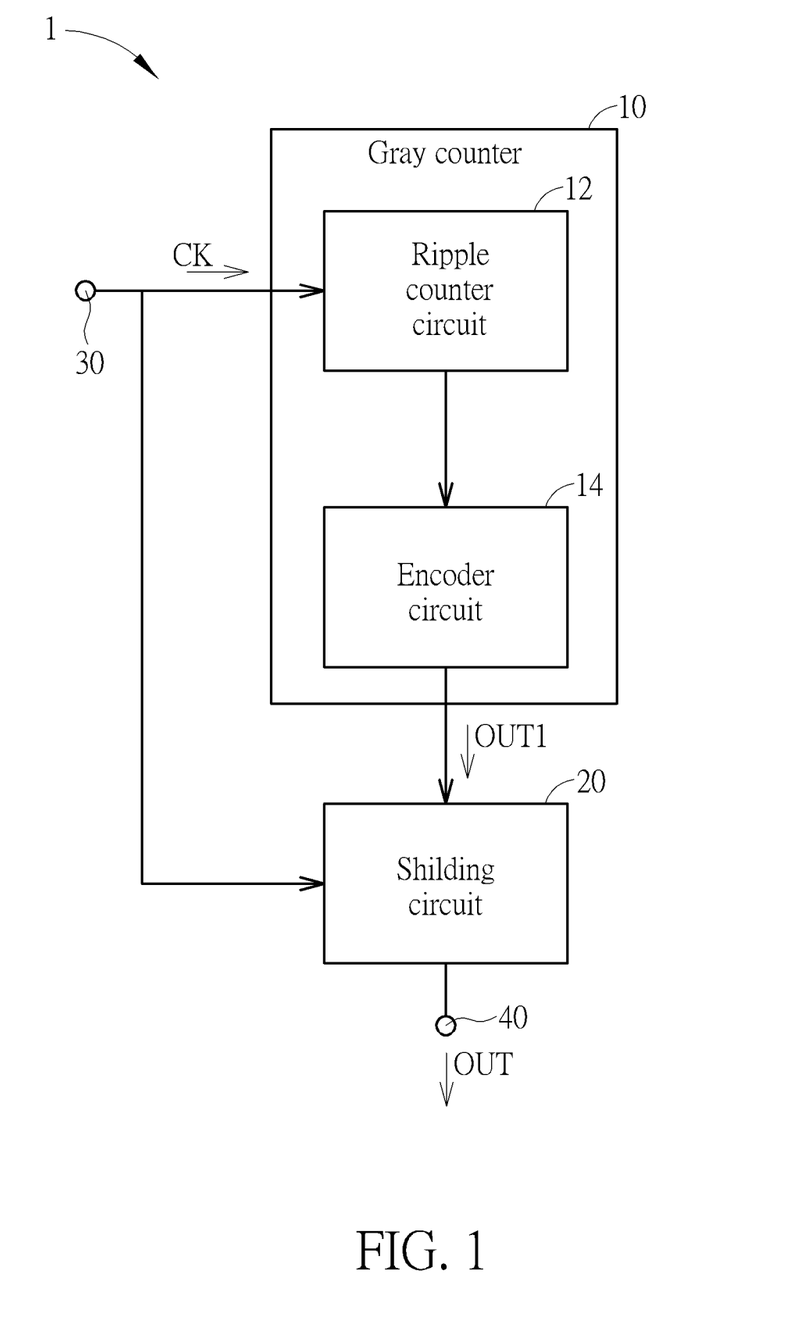
FIG. 1 is a schematic diagram of a clock generating circuit according to an embodiment of the present invention.

Please refer to FIG. 1, which is a schematic diagram of a clock generating circuit 1 according to an embodiment of the present invention. The clock generating circuit 1 includes a gray counter 10, a shielding circuit 20, an input terminal 30 and an output terminal 40. The input terminal 30 is configured to receive a clock signal CK provided by a phase-locked loop (PLL) or a delay-locked loop (DLL), and the output terminal 40 is configured to output an output signal OUT. The gray counter circuit 10 is coupled to the input terminal, and configured to divide the clock signal CK by 2 to produce a first output signal OUT1. It should be noted that the gray counter circuit 10 (also known as a binary counter) includes a ripple counter circuit 12 and an encoder circuit 14. The encoder circuit 14 converts a binary code output by the ripple counter circuit 12 into a gray code output. The process of converting the binary code to the gray code is well known in the art and will not be discussed in detail here.

When the clock signal CK has a very high frequency (e.g., greater than a threshold of 800 MHZ, but not limited thereto), the first output signal OUT1 generated by the gray counter 10 may have a glitch. If the glitch is fed directly to the ADC, it can cause the ADC to malfunction. To eliminate the glitch from the first output signal OUT1, the shielding circuit 20 is coupled to the input terminal 30 (which receives the clock signal CK), the gray counter circuit 10 and the output terminal 40. Specifically, the shielding circuit 20 is configured to shield the glitch from the first output signal OUT1 and generate the output signal OUT based on the clock signal CK. It is important to note that the glitch in the first output signal OUT1 is related to the clock signal CK. Therefore, the shielding circuit 20 may determine when the glitch occurs by analyzing the clock signal CK, and eliminate the glitch accordingly. This ensures that the output signal OUT has a better duty cycle of 50%-50% and contains no glitch (i.e., deglitch), which prevents ADC malfunction or missing code.

Figure 2:
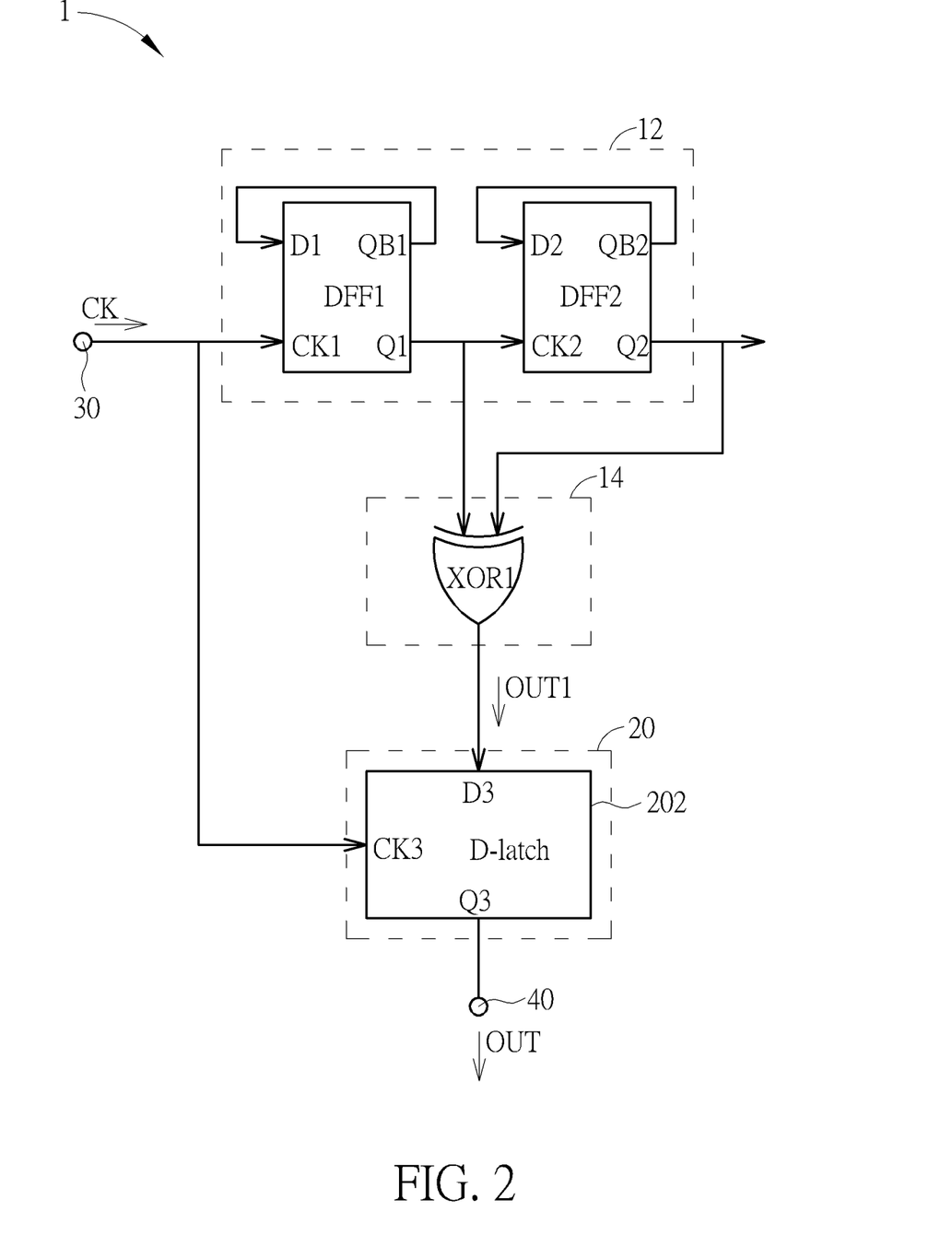
FIG. 2 are the schematic diagrams of the ripple counter circuit, the encoder circuit and the shielding circuit according to the embodiment of the present invention.

To implement the clock generating circuit 1, please refer to FIG. 2, which is a schematic diagram of an embodiment of the clock generating circuit 1. In FIG. 2, the ripple counter circuit 12 includes a first D-flip flop circuit DFF1 and a second D-flip flop circuit DFF2. The first D-flip flop circuit DFF1 includes a first clock input terminal CK1, a first data input terminal D1, a first data output terminal Q1 and a first inverted data output terminal QB1. The second D-flip flop circuit DFF2 includes a second clock input terminal CK2, a second data input terminal D2, a second data output terminal Q2 and a second inverted data output terminal QB2. In detail, the first clock input terminal CK1 is configured to receive the clock signal CK. The first data output terminal Q1 is coupled to the second clock input terminal CK2 and configured to output the first data output signal. The second data output terminal Q2 is configured to output the second data output signal. The first data input terminal D1 is coupled to the first inverted data output terminal QB1. The second data input terminal D2 is coupled to the second inverted data output terminal QB2. On the other hand, the encoder circuit 14 is an exclusive or (XOR) circuit XOR1, including a third input data terminal and a fourth input data terminal to receive the first data output signal and the second data output signal, respectively, and a third data output terminal to output the first output signal OUT1 according to the first data output signal and the second data output signal. In other words, the XOR circuit XOR1 converts the binary codes (i.e., the first data output signal and the second data output signal) into the gray code (i.e., the first output signal OUT1).

Figure 3A:
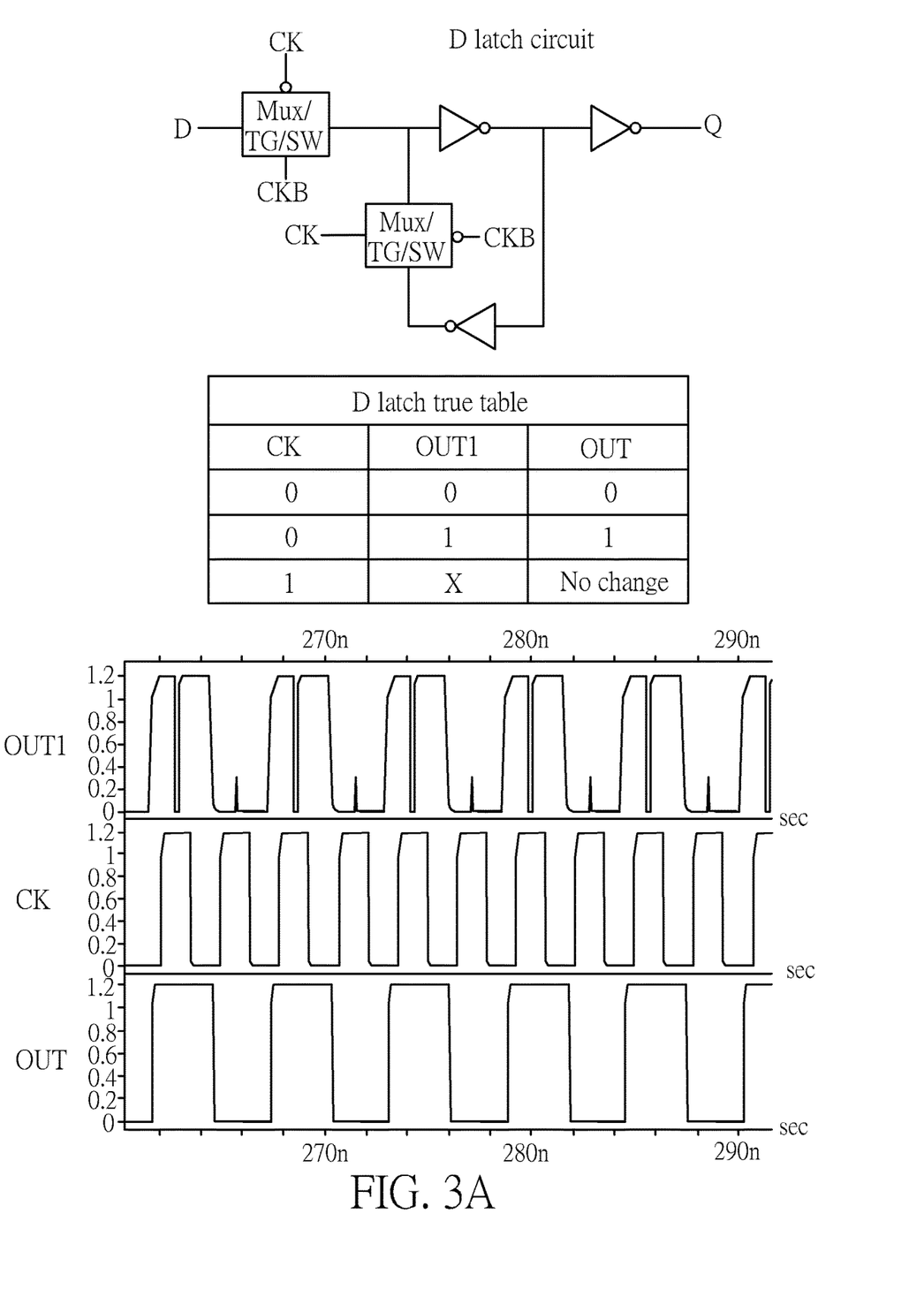
FIG. 3A are a waveform diagram of the clock signal, the first output signal and the output signal, and a truth table of the D-latch circuit according to the embodiment of the present invention.
Figure 3B:
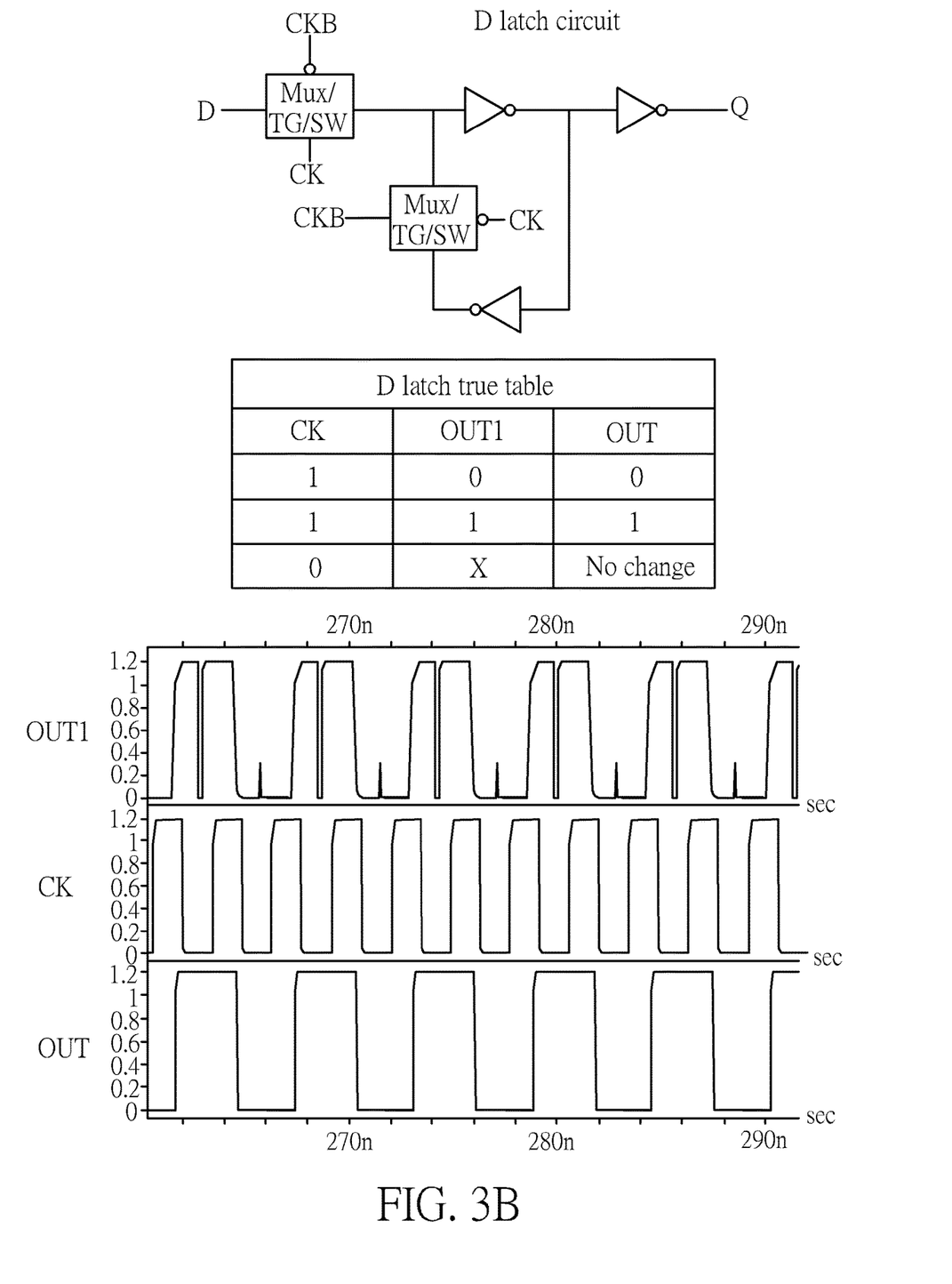
FIG. 3B are a waveform diagram of the clock signal, the first output signal and the output signal, and a truth table of the D-latch circuit according to another embodiment of the present invention.

Furthermore, please refer to FIG. 2, the shielding circuit 20 is a D-latch circuit 202, which includes a fifth input data terminal D3 to receive the first output signal OUT1, a third clock input terminal CK3 to receive the clock signal CK, and a fourth data output terminal Q3 to output the output signal OUT based on the first output signal OUT1 and the clock signal CK. Please refer to FIG. 3A for more details. FIG. 3A is a waveform diagram of the clock signal CK, the first output signal OUT1 and the output signal OUT, as well as a detail circuit diagram and a truth table of the D-latch circuit 202 according to an embodiment of the present invention. As shown in the circuit diagram of the D-latch circuit 202, the D-latch circuit 202 consists of multiplexer MUX, transmission gate TG or switch SW. The D-latch circuit 202 is well known in the art, and will not be repeated here. As shown in the truth table of the D-latch circuit 202, when the clock signal CK is high, the first output signal OUT1 is shield, thus the output signal OUT is latched at the previous status, which means that the output signal OUT does not change. It should be noted that the glitch in the first output signal OUT1 is related to the clock signal CK. Therefore, as shown in the waveform diagram in FIG. 3A, the time when the clock signal CK is high covers the occurrence time of the glitch, so the output signal OUT is latched. In this way, the output signal OUT has no glitch and has a better duty cycle of 50%-50%, which will not cause ADC malfunction or missing code. In another embodiment, the D-latch circuit 202 may be designed to operate inversely as shown in FIG. 3B. For example, when the clock signal CK is low, the first output signal OUT1 is shield, thus the output signal OUT is latched at the previous status. That is, the time when the clock signal CK is low covers the occurrence time of the glitch, so the output signal OUT is latched to eliminate the glitch effect.

It should be noted that FIG. 2 is an embodiment of the present invention, and those skilled in the art may make appropriate adjustments according to the system requirements. For example, the clock generating circuit may provide a plurality of clock signals with various frequencies. Please refer to FIG. 4, which is a schematic diagram of a clock generating circuit 2 according to an embodiment of the present invention. The clock generating circuit 2 is derived from the clock generating circuit 1, so the elements are represented by the same symbols. The difference between the clock generating circuit 2 and the clock generating circuit 1 is that the gray counter 10 of the clock generating circuit 2 has more bits, which provides more output signals with varies frequencies.

Figure 4:
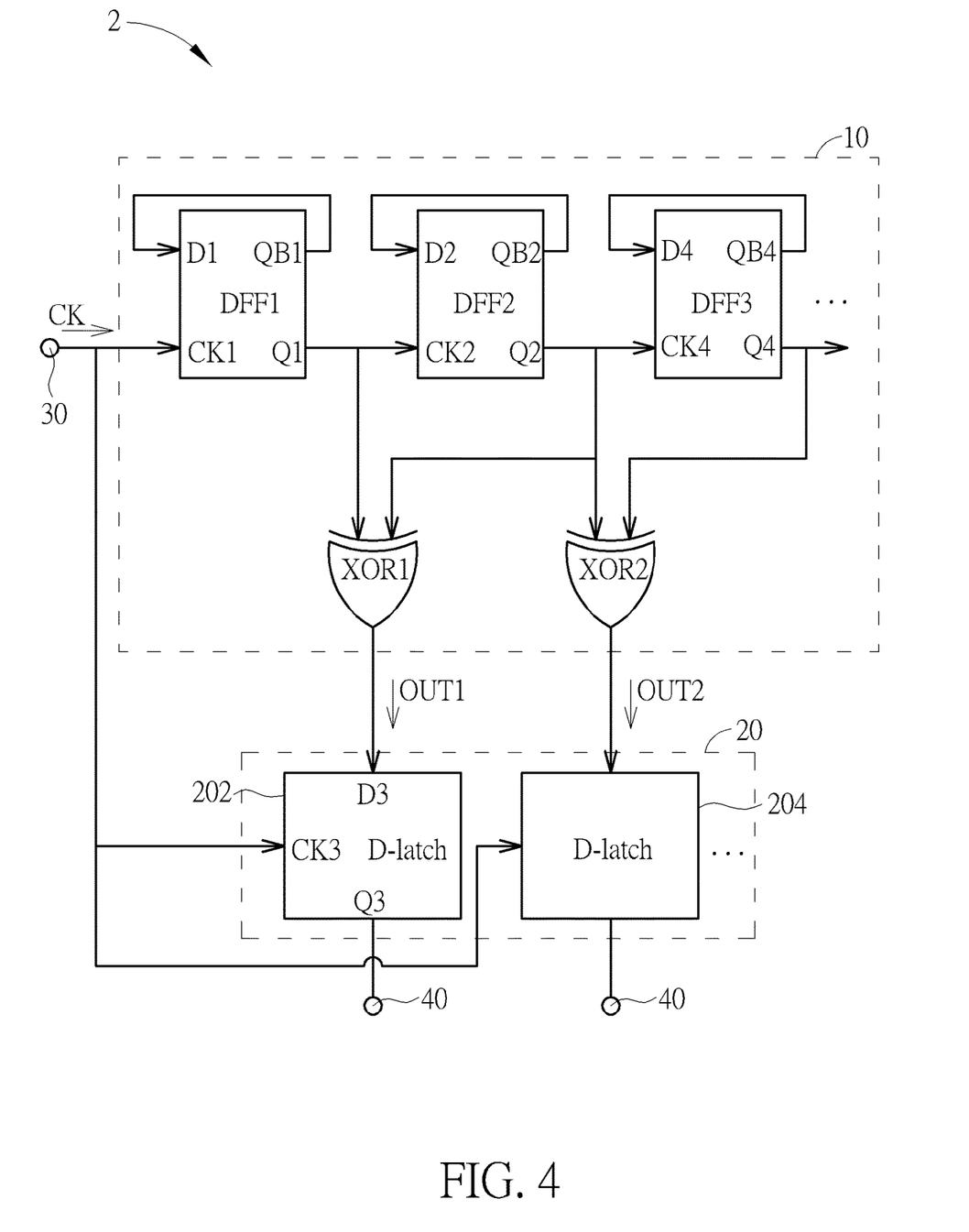
FIG. 4 is a schematic diagram of a clock generating circuit according to an embodiment of the present invention.

In detail, the ripple counter circuit 12 of the clock generating circuit 2 further includes a third D-flip flop circuit DFF3, and the encoder circuit 20 of the clock generating circuit 2 further includes a second XOR circuit XOR2. The third D-flip flop circuit DFF3 of the clock generating circuit 2 includes a fourth clock input terminal CK4, a fourth data input terminal D4, a fourth data output terminal Q4 and a fourth inverted data output terminal QB4. The fourth clock input terminal CK4 is coupled to the second data output terminal Q2, and configured to receive the second data output signal. The fourth data input terminal D4 is coupled to the fourth inverted data output terminal QB4, and the fourth inverted data output terminal Q4 is configured to output a third data output signal. On the other hand, the second XOR circuit XOR2 receives and encoders the second data output signal and the third data output signal into a second output signal OUT2.

Furthermore, the shielding circuit 20 of the clock generating circuit 2 includes a D-latch circuit 204 to shield the glitch in the second output signal OUT2 according to the clock signal CK. The detailed operation of the D-latch circuit 204 is as described above and will not be repeated here.

Figure 5A:
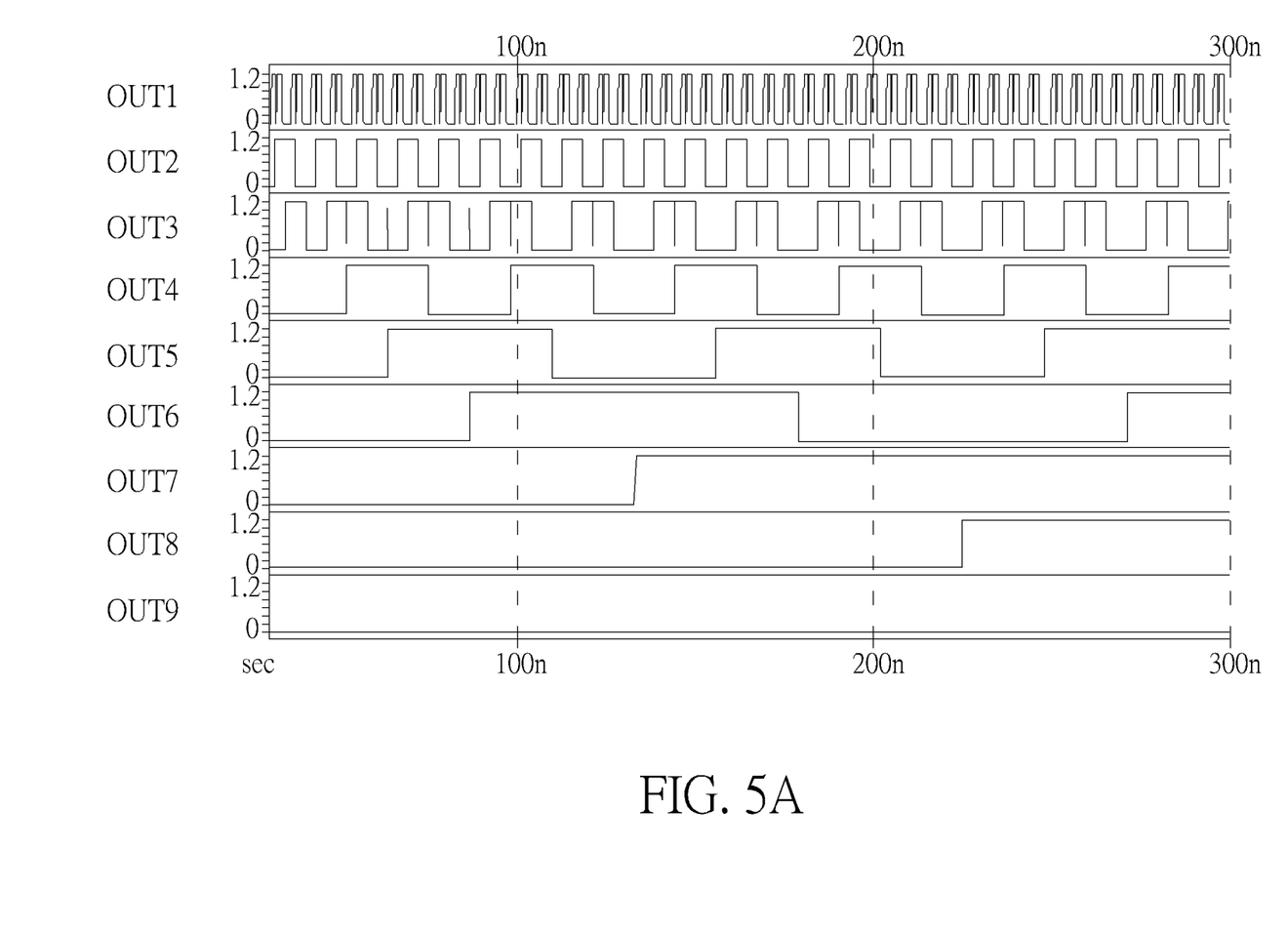
FIG. 5A and FIG. 5B are waveforms of the output signals of the gray counter circuit and the shielding circuit, respectively, according to the embodiment of the present invention.
Figure 5B:
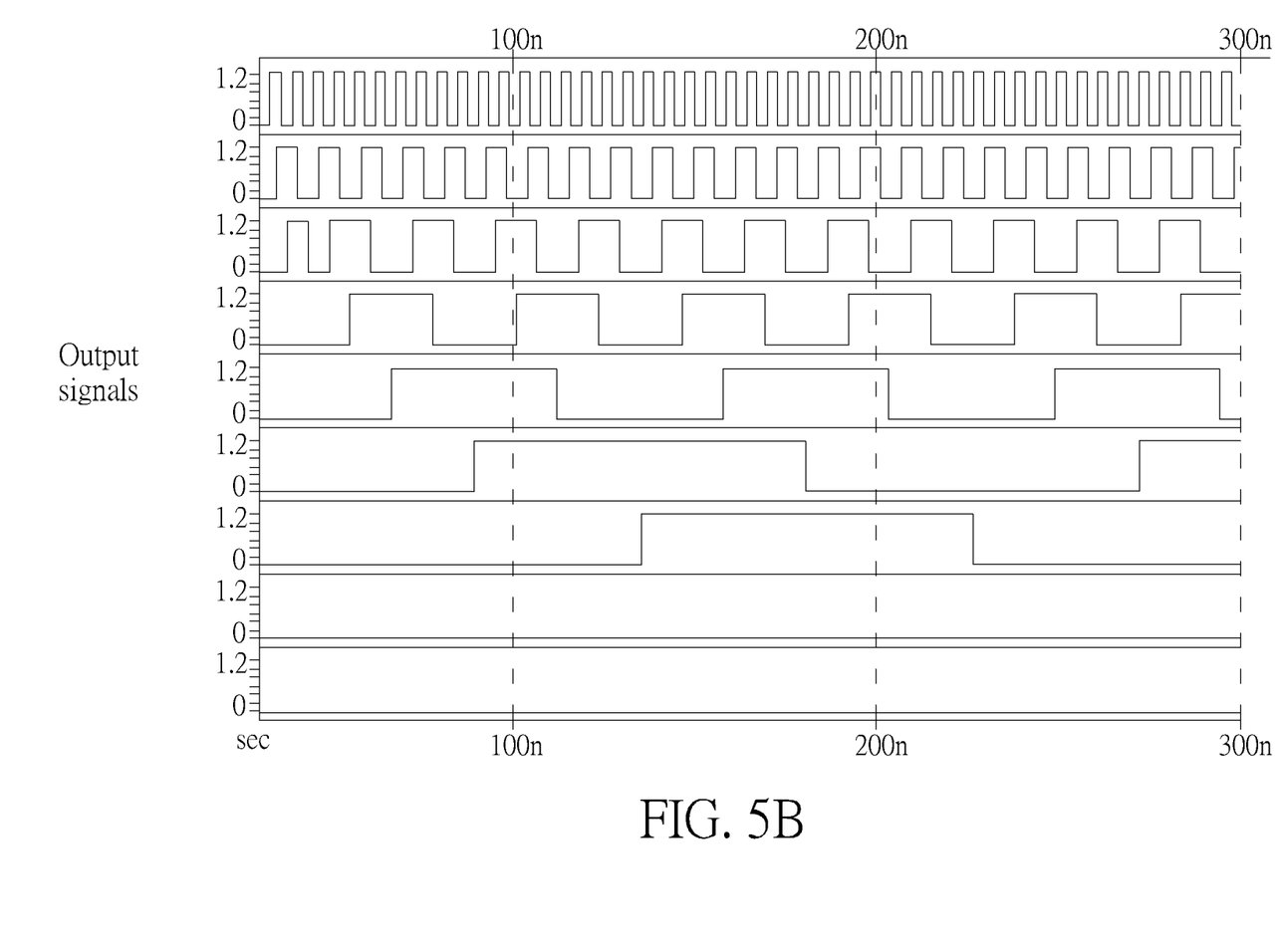

In an embodiment, a clock generating circuit 3 may include a 9-bit gray counter circuit. Please refer to FIGS. 5A and 5B. FIG. 5A and FIG. 5B depict waveforms of the output signals of the gray counter circuit 10 and the shielding circuit 20 of the clock generating circuit 3, respectively, according to embodiments of the present invention. As shown in FIG. 5A, the output signals OUT1-OUT9 of the gray counter circuit 10 may have glitches, which are particularly noticeable in the output signals OUT1-OUT3 with higher frequencies. However, as shown in FIG. 5B, the glitches are eliminated after the output signals OUT1-OUT9 are latched by the shielding circuit 20 according to the clock signal CK.

In summary, the clock generating circuit of the present invention utilizes the latch circuit to eliminate the glitches in the output signal of the gray counter, with the clock signal acting as the source for both the gray counter and the latch circuit. By doing so, the output signals of the clock generating circuit have no glitch and exhibit a better duty cycle of 50%-50%, which helps avoid issues such as ADC malfunction or missing code.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A clock generating circuit, comprising:
an input terminal, configured to receive a clock signal;
an output terminal, configured to output an output signal;
a gray counter circuit, coupled to the input terminal, and
  configured to divide the clock signal to produce a first
  output signal, wherein the first output signal is a gray
  code; and
a shielding circuit, coupled to the input terminal, the gray
  counter circuit and the output terminal, and configured
  to shield a glitch in the first output signal to generate the
  output signal according to the clock signal;
wherein the gray counter circuit comprises:

a ripple counter circuit, configured to output a first data output signal and a second data output signal according to the clock signal; and an encoder circuit, coupled to the ripple counter circuit, and configured to output the first output signal according to the first data output signal and the second data output signal;

wherein the ripple counter circuit comprises:
- a first D-flip flop circuit, comprising a first clock input terminal, a first data input terminal, a first data output terminal and a first inverted data output terminal; and
- a second D-flip flop circuit, comprising a second clock input terminal, a second data input terminal, a second data output terminal and a second inverted data output terminal;
- wherein the first clock input terminal is configured to receive the clock signal, the first data output terminal is coupled to the second clock input terminal and configured to output the first data output signal, the second data output terminal is configured to output the second data output signal, the first data input terminal is coupled to the first inverted data output terminal, and the second data input terminal is coupled to the second inverted data output terminal.

2. The clock generating circuit of claim 1, wherein the encoder circuit is an exclusive or (XOR) circuit comprising a third input data terminal for receiving the first data output signal, a fourth input data terminal for receiving the second data output signal, and a third data output terminal for outputting the first output signal according to the first data output signal and the second data output signal.

3. The clock generating circuit of claim 1, wherein the shielding circuit is a D-latch circuit comprising a fifth input data terminal for receiving the first output signal, a third clock input terminal for receiving the clock signal, and a fourth data output terminal for outputting the output signal according to the first output signal and the clock signal.

* * * * *